(12) United States Patent
Fujioka

(10) Patent No.: US 7,443,687 B2
(45) Date of Patent: Oct. 28, 2008

(54) HEAT SINK MOUNTING DEVICE AND MOUNTING METHOD, AND SERVER BLADE USING THE SAME

(75) Inventor: Koichi Fujioka, Tokyo (JP)

(73) Assignee: NEC Corporation, Kawasaki, Kanagawa (JP)

( * ) Notice: Subject to any disclaimer, the term of this patent is extended or adjusted under 35 U.S.C. 154(b) by 41 days.

(21) Appl. No.: 11/715,853

(22) Filed: Mar. 9, 2007

(65) Prior Publication Data

US 2007/0217164 A1 Sep. 20, 2007

(30) Foreign Application Priority Data

Mar. 14, 2006 (JP) .............................. 2006-070015

(51) Int. Cl.
*H05K 7/20* (2006.01)
(52) U.S. Cl. ........................ 361/721; 361/790; 257/724
(58) Field of Classification Search ........................ None
See application file for complete search history.

(56) References Cited

U.S. PATENT DOCUMENTS

| 5,671,121 | A | * | 9/1997 | McMahon | 361/719 |
| 5,734,555 | A | * | 3/1998 | McMahon | 361/704 |
| 6,219,243 | B1 | * | 4/2001 | Ma et al. | 361/704 |
| 6,356,448 | B1 | * | 3/2002 | DiBene et al. | 361/721 |
| 6,580,611 | B1 | * | 6/2003 | Vandentop et al. | 361/704 |
| 6,687,129 | B1 | * | 2/2004 | Wilson et al. | 361/730 |
| 6,801,431 | B2 | * | 10/2004 | Hartke et al. | 361/704 |
| 6,816,378 | B1 | * | 11/2004 | Belady et al. | 361/704 |
| 7,280,365 | B2 | * | 10/2007 | Belson et al. | 361/721 |

FOREIGN PATENT DOCUMENTS

JP 58-105556 6/1983

* cited by examiner

*Primary Examiner*—Boris L Chervinsky
(74) *Attorney, Agent, or Firm*—McGinn Law Group, PLLC

(57) ABSTRACT

A heat sink mounting device according to the present invention can secure a mounting space of the heat sink sufficiently, mount a heat sink with large capacity, and use a main board in common even when a dual central processing unit (CPU) is constituted by extension of CPU. A main board has an opening. A CPU is mounted on a main surface of the main board. A sub board is attached on the main surface of the main board to permit the opening to be covered. An extension CPU is mounted on the sub board through the opening from a rear face side of the main board. A first heat sink is mounted in the main surface side of the main board to permit the CPU and the opening to be covered. A second heat sink is mounted in the rear face side of the main board to permit the extension CPU and the opening to be covered.

9 Claims, 11 Drawing Sheets

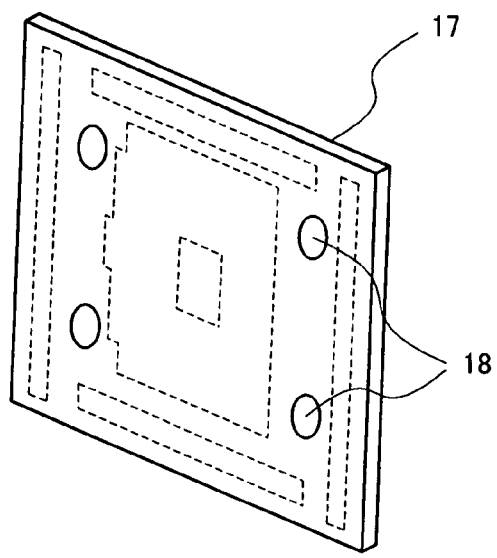 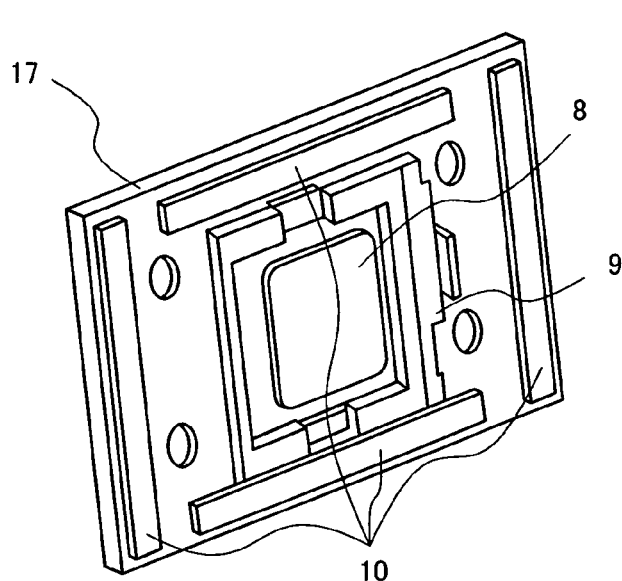
FIG.4A                    FIG.4B

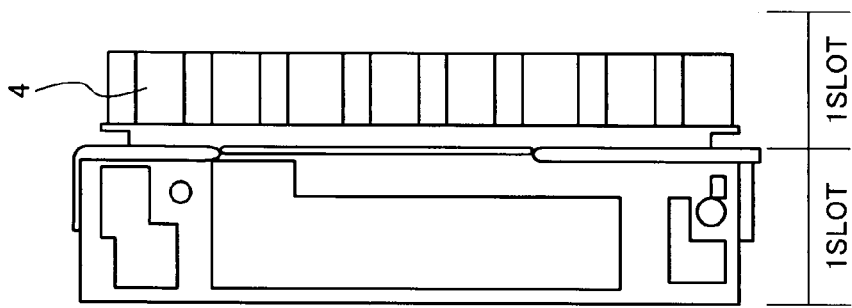
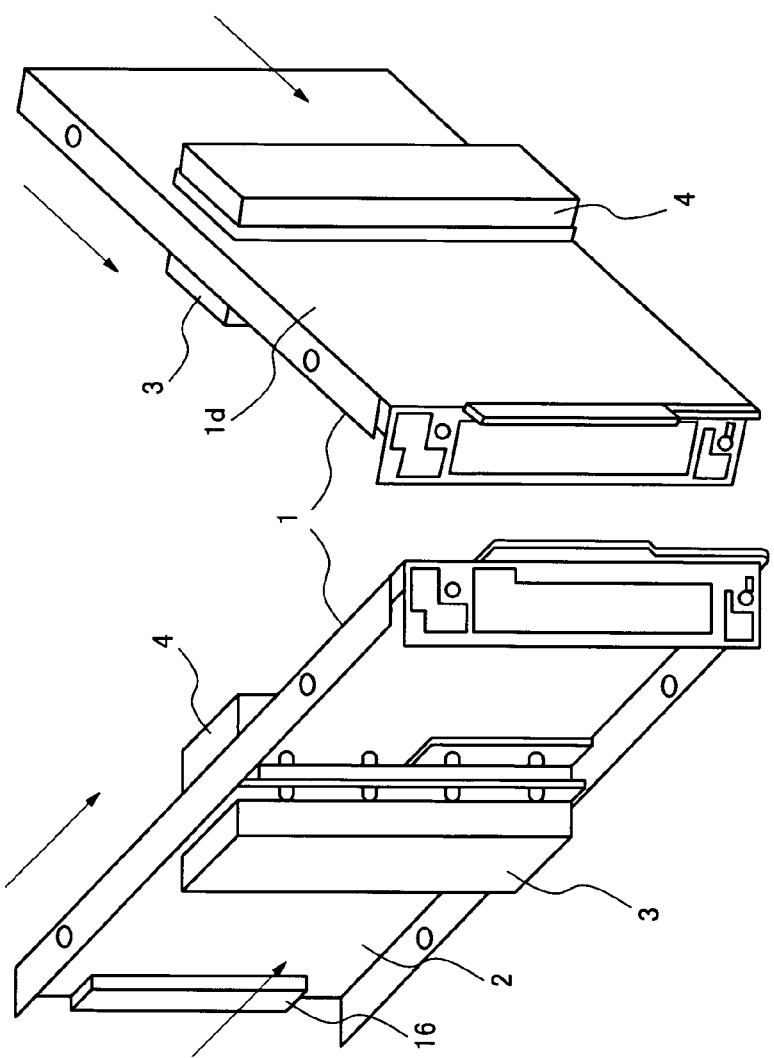
FIG.10C
FIG.10B
FIG.10A

HEAT SINK MOUNTING DEVICE AND MOUNTING METHOD, AND SERVER BLADE USING THE SAME

FIELD OF THE INVENTION

The present invention relates to a heat sink mounting device and mounting method, more particularly to the heat sink mounting device and mounting method for cooling a CPU and an extension CPU in an electronic apparatus.

DESCRIPTION OF THE RELATED ART

The electronic apparatus, for example, a blade server installs a plurality of server blades in a server frame. In each of the server blades, a central processing unit (CPU), a memory, a hard disk, and so on which are components of a computer are mounted on one board. The blade server is equipped with a required number of boards. Since the server blade has a thin and elongate face (blade), the blade server can make board density high. Moreover, by using many boards, the blade server is reliable.

Conventionally, in the server blade, the CPU and a heat sink for cooling the CPU are mounted in a surface of the board. Recently, since the size of the heat sink for cooling the CPU becomes large as a heating value of the CPU increases, it is difficult to secure a mounting space of the heat sink sufficiently.

A technology about a heat sink mounting is disclosed in publication of JP 58-105556 A. In the conventional technology, when a LSI package module with a heat sink fixed on a LSI package is attached on a printed circuit board, an opening which the heat sink penetrates is prepared in the printed circuit board so that a heat sink may project at a rear face of the printed circuit board.

According to the above-mentioned composition, thickness of the printed circuit board depending on a height of the heat sink is made small, and high mounting density is obtained when the printed circuit board is mounted in piles.

Moreover, since the heat sink is mounted in the rear face of the printed circuit board, cooling effect is increased by a fresh air which flows equally in both sides of the printed circuit board.

However, even the above-mentioned conventional technology, since the size of the heat sink for cooling the LSI becomes large as a heating value of the LSI increases, it is difficult to secure a mounting space of the heat sink sufficiently.

On the other hand, in the server blade, it is required that a board for single CPU and a board for dual CPU are used in common and that attachment of the CPU and a heat sink for cooling the CPU is easy in case of CPU extension.

SUMMARY OF THE INVENTION

The present invention has been made to solve the above and other exemplary problems, and therefore an exemplary feature of the present invention is to provide a heat sink mounting device which is able to mount a heat sink with large capacity, to use each board for single CPU and for dual CPU in common, and to make attachment of a CPU and a heat sink for cooling the CPU easy in case of CPU extension.

In order to attain the above-mentioned and other exemplary features, the present invention provides an exemplary heat sink mounting device. The heat sink mounting device includes: a first board which includes an opening; a first electronic device which is mounted on the main surface of the first board; a second board which is attached on the main surface of the first board to permit the opening to be covered; a second electronic device which is mounted on the second board through the opening from a rear face side of the first board; a first heat sink which is mounted in the main surface side of the first board to permit the first electronic device and the opening to be covered; and a second heat sink which is mounted in the rear face side of the first board to permit the second electronic device and the opening to be covered.

Also, in order to attain the above-mentioned and other exemplary features, the present invention provides an exemplary heat sink mounting method. The heat sink mounting method includes: forming an opening in a first board; mounting a first electronic device on a main surface of the first board; attaching a second board on the main surface of the first board to permit the opening to be covered; mounting a first heat sink in the main surface side of the first board to permit the first electronic device and the opening to be covered; mounting a second electronic device on the second board through the opening from a rear face side of the first board; and mounting a second heat sink in the rear face side of the first board to permit the second electronic device and the opening to be covered.

According to the above configuration, the exemplary heat sink mounting device of the present invention can secure a mounting space of the heat sink sufficiently and mount a heat sink with large capacity.

Also, a main board for mounting CPU can be used in common even when a dual CPU is constituted by extension of CPU.

Furthermore, since the extension CPU and the heat sink for cooling the extension CPU can be mounted in case of extension of CPU without removing the CPU and the heat sink mounted in the main board, workability improves.

BRIEF DESCRIPTION OF THE DRAWINGS

The above and other exemplary features, and advantages of the present invention will become more apparent from the following detailed description when taken in conjunction with the accompanying drawings wherein:

FIGS. 4A and 4B are respectively perspective views of a main surface and a rear face of a sub board used in the server blade shown in FIG. 1;

FIGS. 10A, 10B and 10C are perspective views showing the blade server mounting a dual CPU, FIGS. 10A and 10B are respectively perspective views showing air flow, and FIG. 10C is a front view showing the server blade with a mounting pitch.

DETAILED DESCRIPTION OF THE EXEMPLARY EMBODIMENTS

Figure 1:
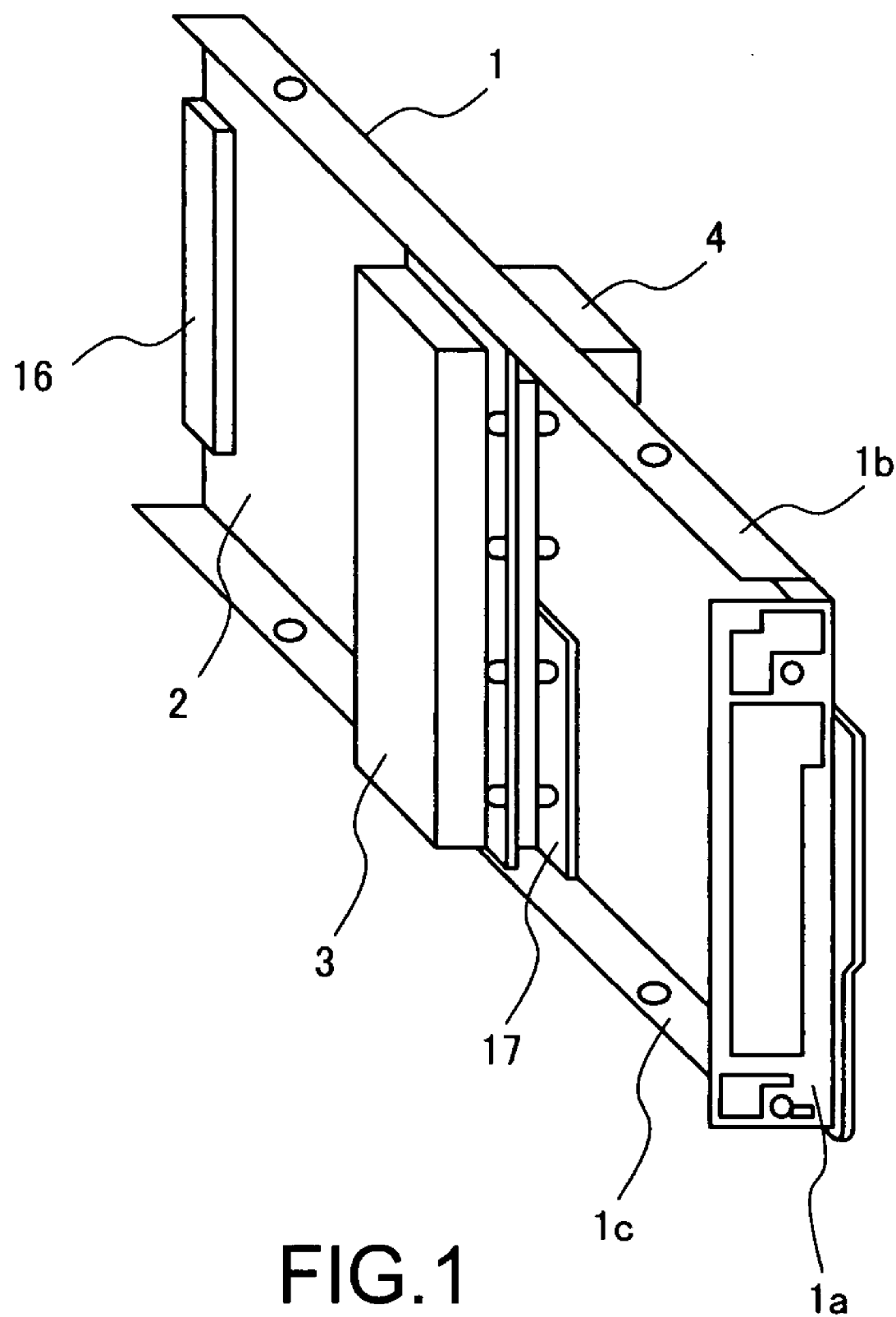
FIG. 1 is a perspective view showing an exemplary embodiment of a heat sink mounting device according to the present invention.
Figure 2B:
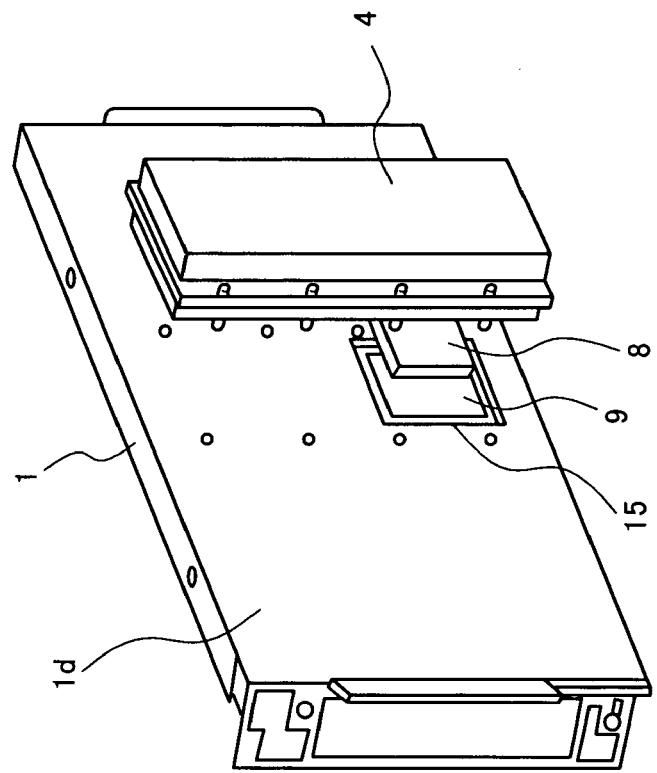
FIGS. 2A and 2B are respectively exploded perspective views of a main surface and a rear face of a server blade shown in FIG. 1.
Figure 2A:
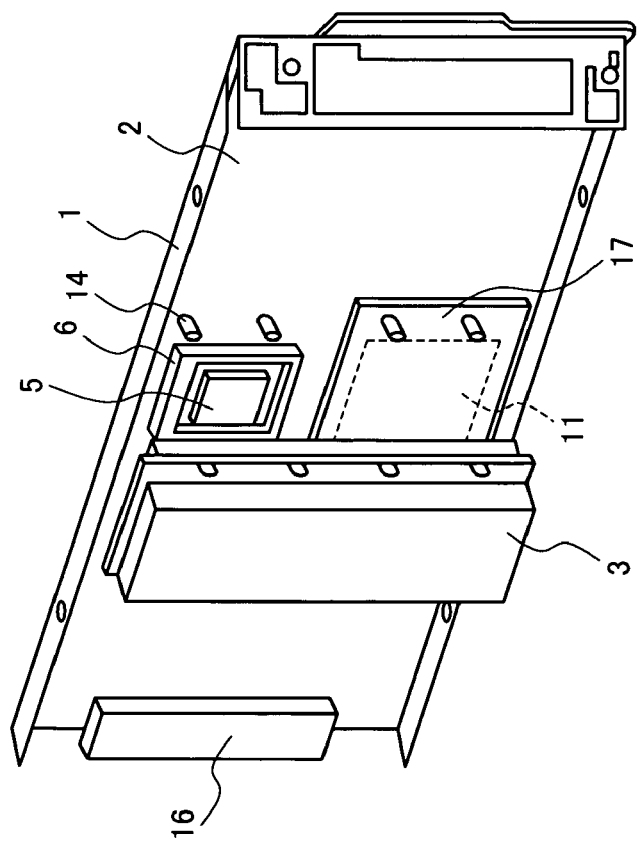

Hereinafter, a description will be given in more detail of an exemplary heat sink mounting device according to the present invention with reference to the accompanying drawings. FIG. 1 is a perspective view showing an exemplary embodiment of a heat sink mounting device according to the present invention. In FIG. 1, the heat sink mounting device is a server blade. FIGS. 2A and 2B are respectively exploded perspective views of a main surface and a rear face of a server blade shown in FIG. 1.

Referring to FIGS. 1, 2A and 2B, a server blade of an exemplary embodiment according to the present invention includes a frame 1, a main board (first board) 2, a heat sink (first heat sink) 3, a heat sink (second heat sink) 4, a CPU (first CPU) 5, an extension CPU (second CPU) 8, and a sub board (second board) 17.

The frame 1 includes a front panel 1a, two side panels 1b and 1c and a floor plate 1d. Also, the frame 1 (plate 1d) includes an opening 15 and a plurality of studs 14 for mounting the heat sinks 3 and 4.

The main board 2 includes a connector 16, an opening 11 facing the opening 15 and a plurality of through-holes to pass the studs 14. The main board 2 is attached by screw cramp (not shown) in the plate 1d of the frame 1. The CPU 5 is mounted on a main surface of the main board 2. The heat sink 3 is mounted on the main surface of the main board 2, and the CPU 5 and the opening 11 are covered with the heat sink 3.

Here, other electronic components except the CPU 5 and the extension-CPU 8 in the main board 2 are omitted. Also, the main board 2 is attached in the plate 1d of the frame 1 with insulated processing of a rear face or an air gap between a rear face of the main board 2 and a main surface of the plate 1d.

The sub board 17 includes a plurality of through-holes to pass the studs 14. The sub board 17 is attached on the main surface of the main board 2 by using an after-mentioned connector, and the opening 11 is covered with the sub board 17. The extension CPU 8 is mounted on the rear face of the sub board 17 through the openings 11 and 15 from a rear face side of the plate 1d. The heat sink 4 is mounted in the rear face side of the plate 1d, and the extension CPU 8 and the opening 15 are covered with the heat sink 4.

The main board 2 and the sub board 17 are electrically connected by using a connector attached in a circumference of the opening 11. The sub board 17 and the extension CPU 8 are electrically connected by using a socket attached on the rear face of the sub board 17.

By the above mentioned server blade, the CPU 5 and the heat sink 3 for cooling the CPU 5 are mounted on the main surface side of the main board 2, and the extension CPU 8 and the heat sink 4 for cooling the extension CPU 8 are mounted in the rear face side of the plate 1d, respectively.

Next, a description will be given about each composition of the server blade according to the present invention.

Figure 3:
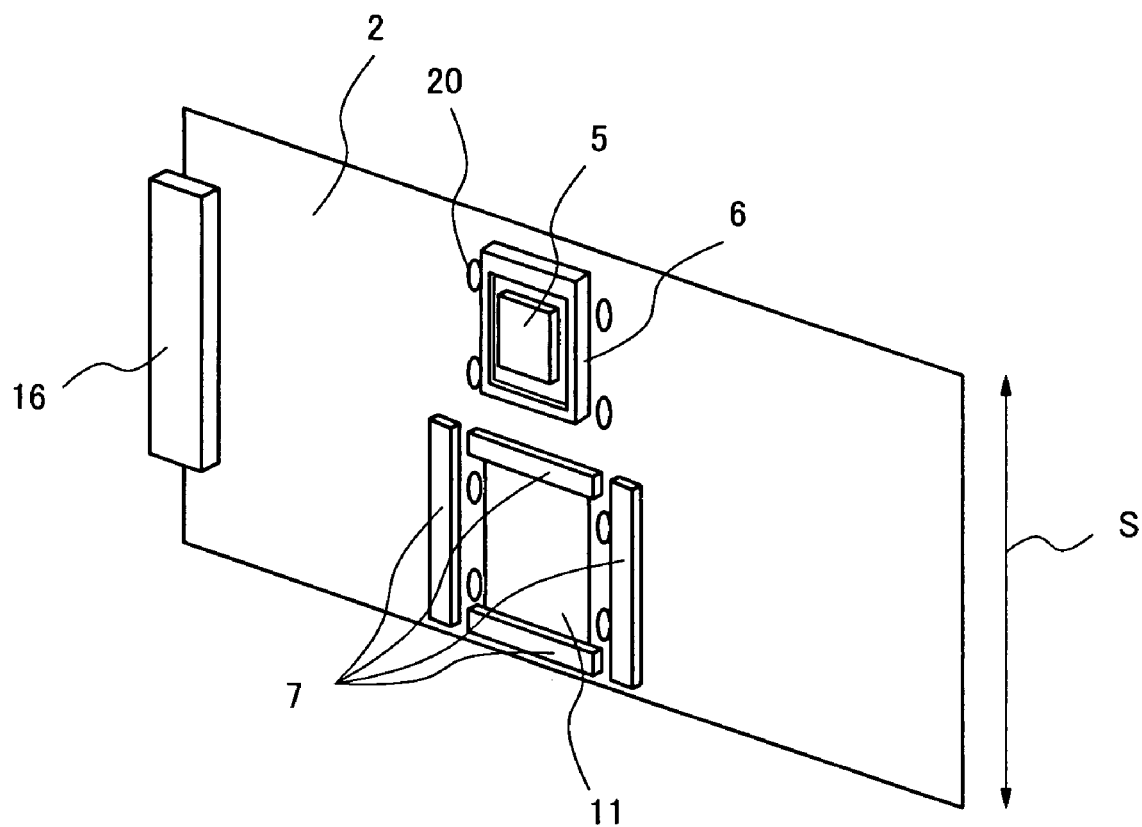
FIG. 3 is a perspective view of a main board used in the server blade shown in FIG. 1.

First, a composition of the main board 2 is described. FIG. 3 is a perspective view of a main, board used in the server blade shown in FIG. 1.

As shown in FIG. 3, the main board 2 includes an opening 11 and a plurality of through-holes 20, and a socket 6, connectors 7 and the connector 16 is attached on the main surface of the main board 2. The opening 11 has the same rectangular shape as the opening 15 of the frame 1 and the connectors 7 is attached on the circumference of the opening 11. The plurality of through-holes 20 is prepared in the same position as the stud position of the frame 1. In the socket 6, the CPU 5 is mounted to connect with the main board 2. The connectors 7 is used for connecting with the sub board 17. The connector 16 is used for connecting to other server blade or a peripheral circuitry (not shown in FIG. 3), for example, power supply circuit.

Next, a composition of the sub board is explained. FIGS. 4A and 4B are respectively perspective views of a main surface and a rear face of a sub board used in the server blade shown in FIG. 1.

The sub board 17 includes a plurality of through-holes 18, and a socket 9 and a connector 10 are attached on the rear face of the sub board 17. The sub board 17 is a rectangular board with size covering the opening 11 (FIG. 3). The plurality of through-holes 18 is prepared for passing the stud of the frame 1. The socket 9 is used for connecting the extension CPU 8. The connector 10 is used for connecting with the connector 7 of the main board 2 in FIG. 3. The socket 9 and the connector 10 are connected electrically. Therefore, the extension CPU 8 is connected with the main board 2 electrically and functions as a part of a circuit of the main board 2.

According to FIG. 2A, after the sub board 17 is attached on the main surface of the main board 2, the extension CPU 8 mounted on the rear face of the sub board 17 can be viewed through the opening 11 of the main board 2 and the opening 15 of the frame 1. This is because the extension CPU 8 is mounted to the socket 9 through the openings 11 and 15.

Figure 5A:
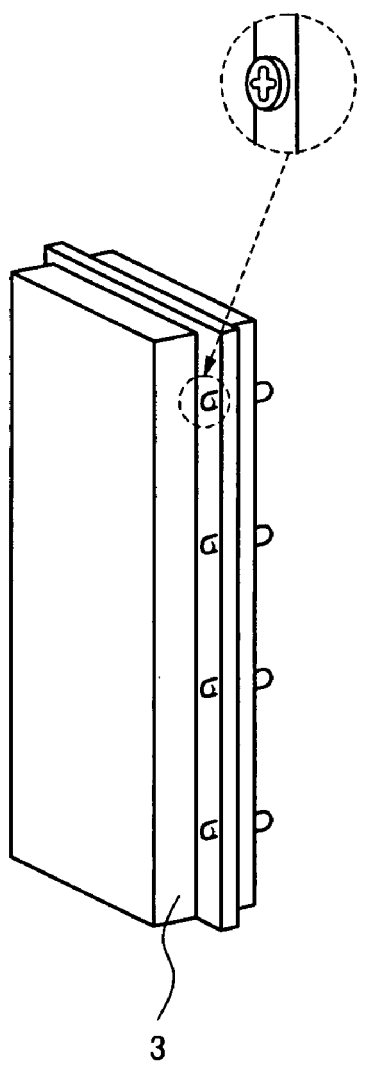
FIGS. 5A and 5B are respectively perspective views of a main surface and a rear face of a heat sink used in the server blade shown in FIG. 1.
Figure 5B:
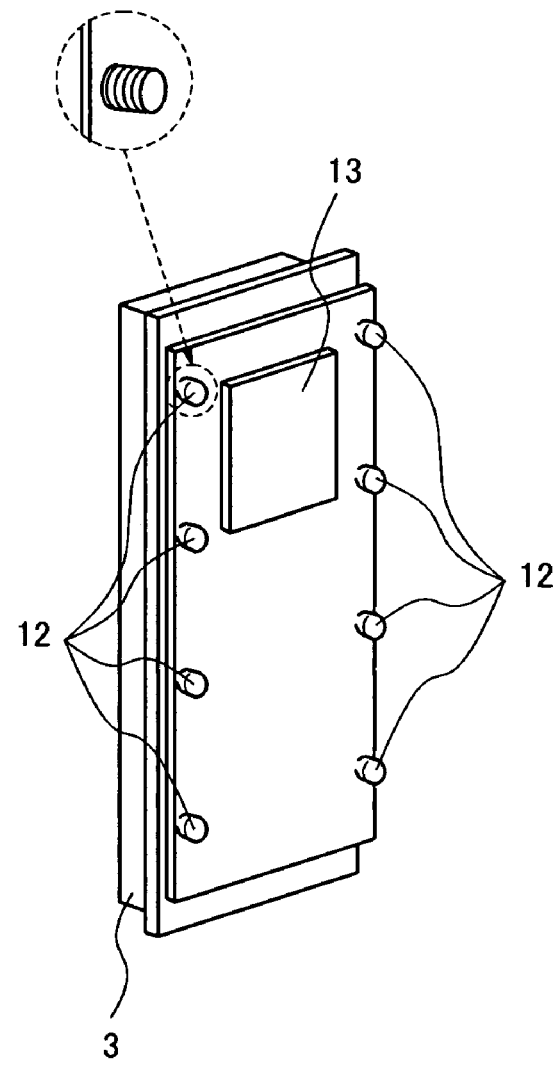

Next, a composition of the heat sink 3 and 4 are explained. FIGS. 5A and 5B are respectively perspective views of a main surface and a rear face of a heat sink used in the server blade shown in FIG. 1. Here, the heat sink 3 mounted in the main surface side of the frame 1 is explained as an example.

The heat sink 3 has a plurality of fins (not shown), a thermal interface 13 and a plurality of screws 12. As shown in FIGS. 5A and 5B, the plurality of fins is expressed as an overall size. The thermal interface 13 is, for example, a silicone sheet which silicone was processed in the shape of a sheet and is used to efficiently conduct heat generated by the CPU 5. The plurality of screws 12 is fit-connected with a plurality of studs 14 of the frame 1 in FIG. 2A. Materials of the heat sink 3 or common heat sink include aluminum, copper, or steel.

The heat sink 3 has a size about equal to the size of height directions of the main board 2 shown in FIG. 3 in order to enhance effectiveness for cooling the CPU 5.

Also, the heat sink 4 is used in common by adjusting the position of the thermal interface 13 and the plurality of screws 12.

Figure 6:
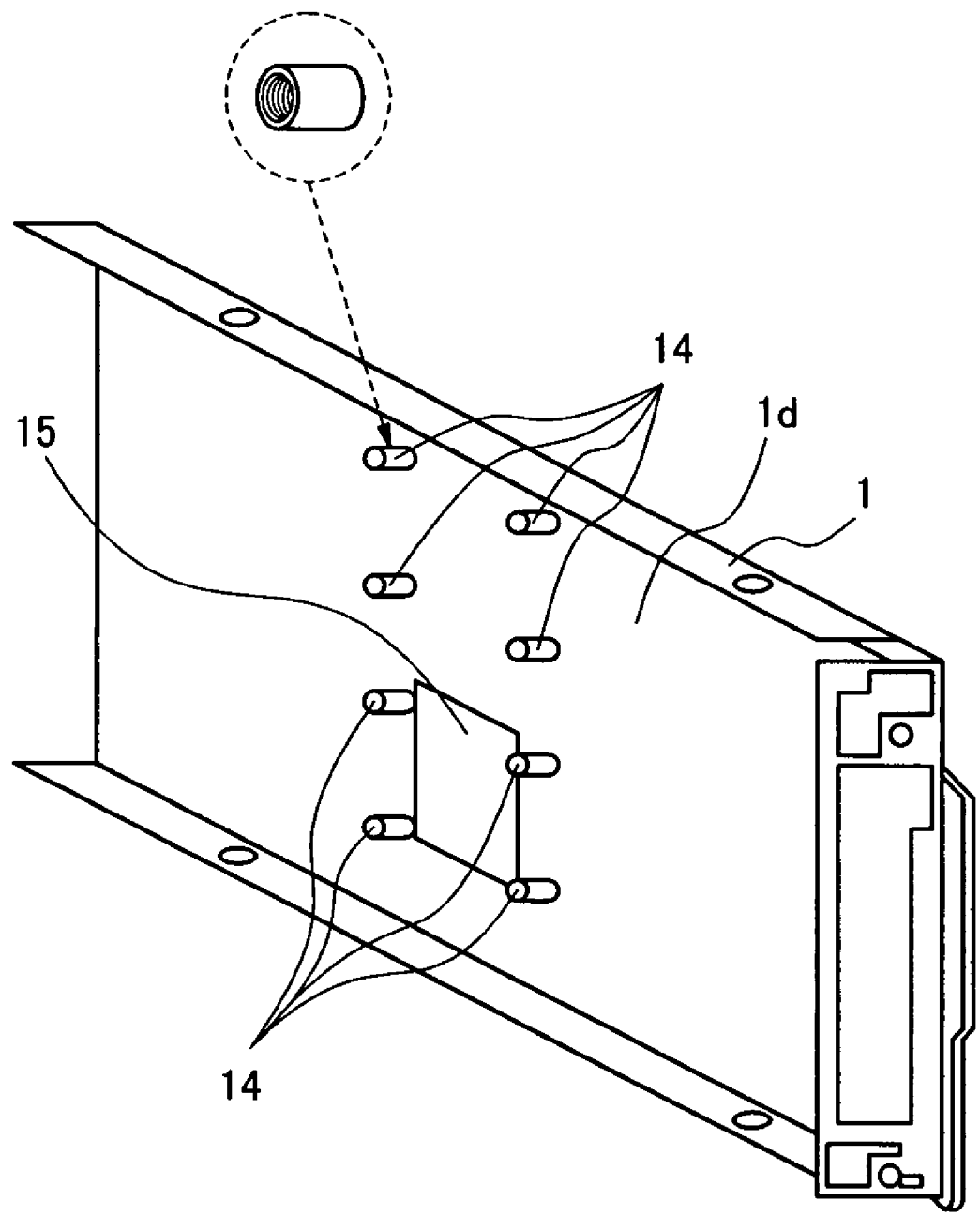
FIG. 6 is a perspective view of a flame used in the server blade shown in FIG. 1.

Next, a composition of a frame is explained. FIG. 6 is a perspective view of a flame used in the server blade shown in FIG. 1.

As shown in FIG. 6, the frame 1 includes the opening 15 and the plurality of studs 14. The opening 15 has the same rectangular shape as the opening 11 of the main board 2 in FIG. 3. The plurality of studs 14 is used for mounting the heat sink 3 and heat sink 4 in the main surface side and the rear face side of the plate 1d. The studs 14 are female screw of penetration shown in a partial enlarged view.

Next, a description will be given about an assembly procedure of the server blade.

Figures 7A, 7B:
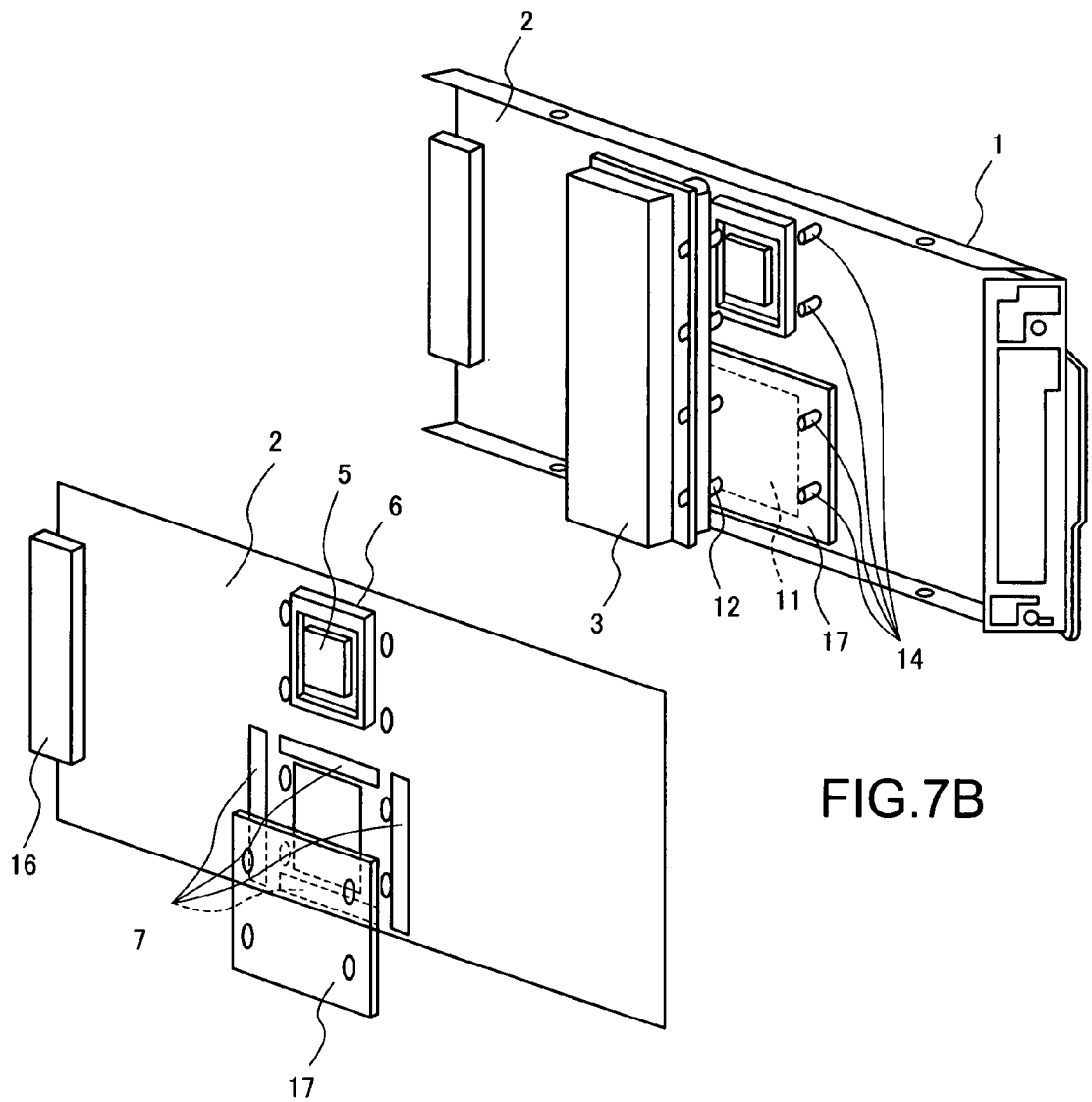
FIGS. 7A and 7B are perspective views to explain a mounting procedure of the heat sink on the single CPU.

First, an assembly procedure in case of the single CPU mounting is explained. FIGS. 7A and 7B are perspective views to explain a mounting procedure of the heat sink on the single CPU.

As shown in FIG. 7A, the sub board 17 is attached in the main surface of the main board 2 by connecting the connector 7 of the main board 2 and the connector 10 of the sub board 17 in FIG. 4B. At the case of the single CPU mounting, there is no CPU in the sub board 17.

Next, as shown in FIG. 7B, the main board 2 in which the sub board 17 was attached is attached in the frame 1.

Then, the heat sink 3 for cooling the CPU 5 is arranged on the main surface of the main board 2, and is fixed to the main surface of the main board 2 by fit-connecting the screw 12 of the heat sink 3 and the stud 14 of the frame 1.

Figures 8A, 8B:
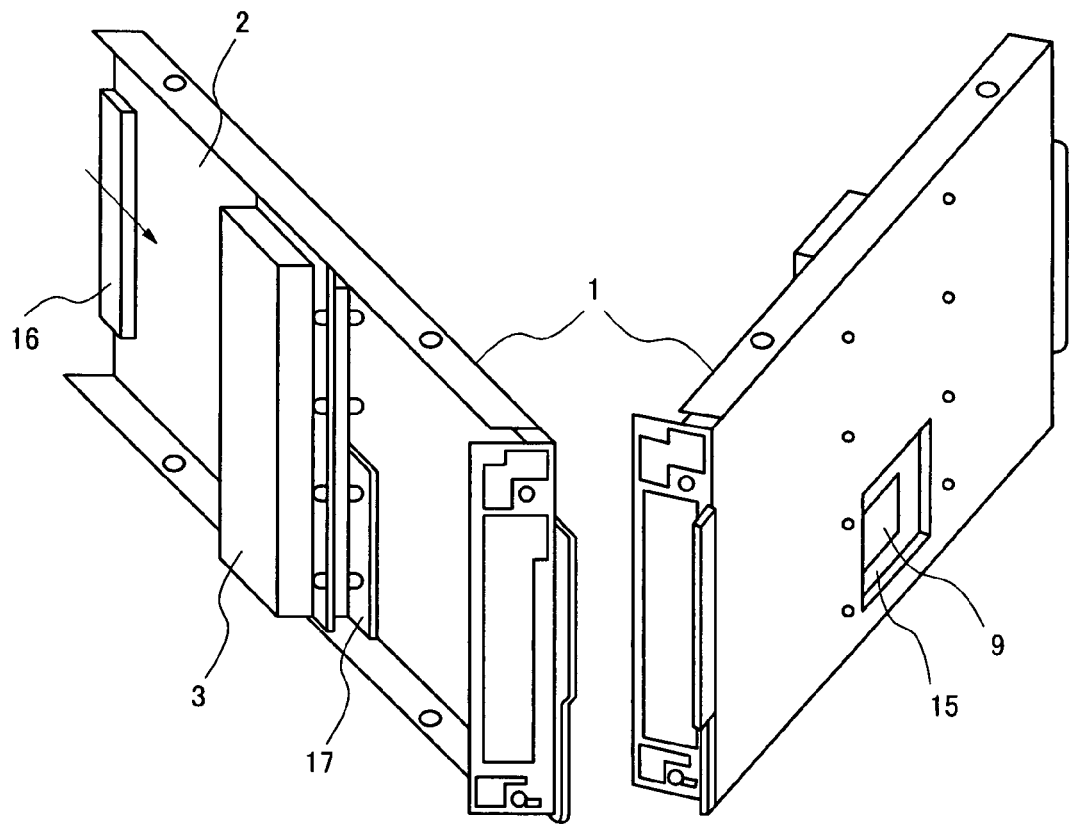
FIGS. 8A and 8B are respectively perspective views of a main surface and a rear face after single CPU mounting.

FIGS. 8A and 8B are respectively perspective views of a main surface and a rear face after single CPU mounting. As shown in FIG. 8A, the heat sink 3 is mounted in the main surface side of the main board 2. And as shown in FIG. 8B, the socket 9 prepared in the rear face of the sub board 17 can clearly visible from the opening 15 of the rear face of the plate 1d. The extension CPU 8 is not mounted in the state of the single CPU. Also, an air flow 16 for cooling the CPU 5 is blowing in the direction of the arrow of FIG. 8A, and cools the heat sink 3.

Figure 9:
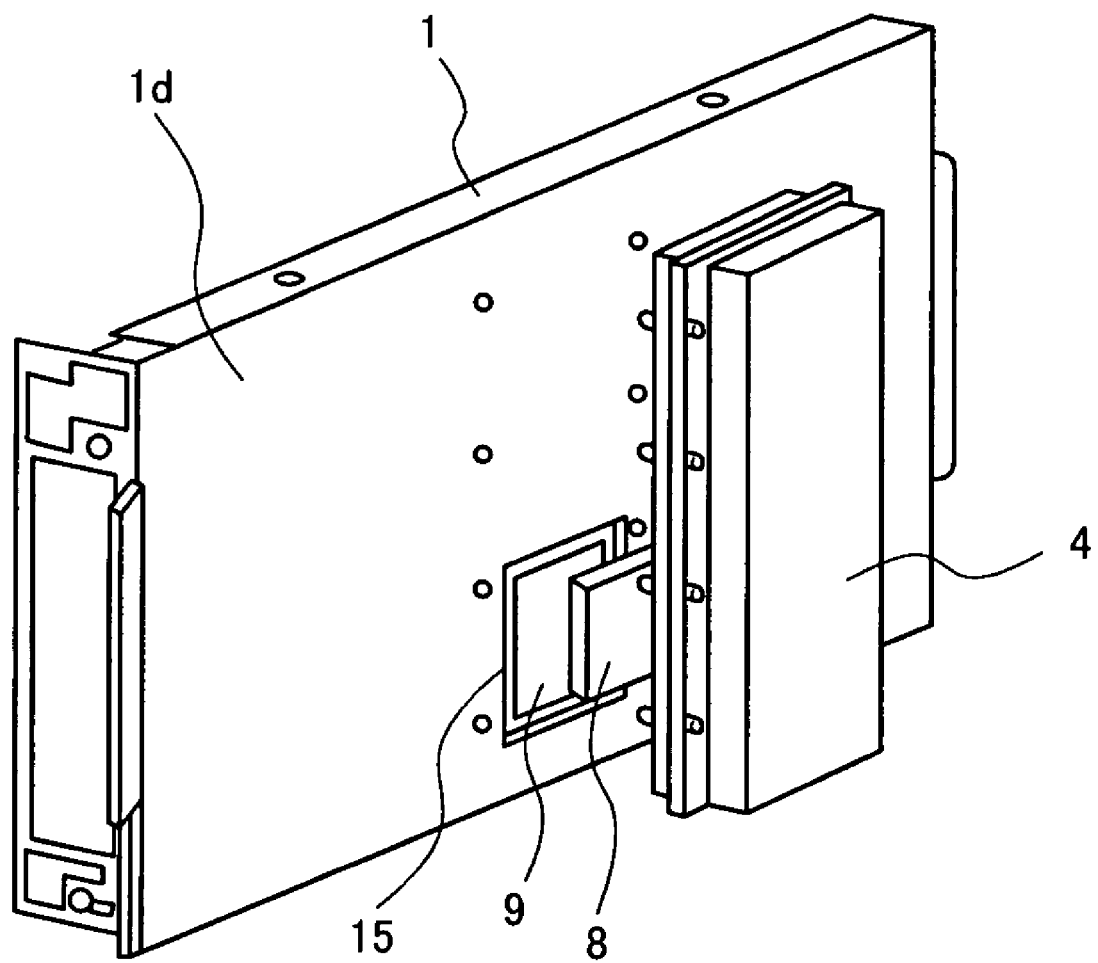
FIG. 9 is an exploded perspective view to explain a mounting procedure of the heat sink on CPU extension.

Next, an assembly procedure in case of CPU extension is explained. FIG. 9 is an exploded perspective view to explain a mounting procedure of the heat sink on CPU extension.

As shown in FIG. 9, the extension CPU 8 is mounted to the socket 9 attached in the rear face of the sub board 17. Then, the heat sink 4 is mounted in the rear face of the frame 1 as the extension CPU 8 and opening 15 is covered. Thus, in case of extension of CPU, since the extension CPU 8 and the heat sink 4 for cooling the extension CPU 8 are attached through the opening 15 from the rear face of the plate 1d without removing the heat sink 3 mounted in the main surface of the main board 2 for cooling, the CPU 5, extension work becomes easy.

Next, an assembly procedure in case of dual CPU mounting is explained. FIGS. 10A, 10B and 10C are perspective views showing the blade server mounting a dual CPU, FIGS. 10A and 10B are respectively perspective views showing air flow, and FIG. 10C is a front view showing the server blade with a mounting pitch.

As shown in FIGS. 10A and 10B, the heat sinks 3 and 4 are mounted on the main surface side and the rear face side of the frame 1, respectively, and are cooled by the air flow 16 which flows along each sides of the frame 1. Also, as shown in FIG. 10c, a mounting pitch of the blade server is settled by the width of the blade of one slot width in case of the single CPU. On the other hand, in case of the dual CPU, since the heat sink 4 for cooling the extension CPU is mounted, the mounting pitch of two slots is needed. However, according to the exemplary embodiment of the present invention, since the heat sink with large capacity can be mounted, the CPU with high heating value can be mounted in equipments.

Figure 11:
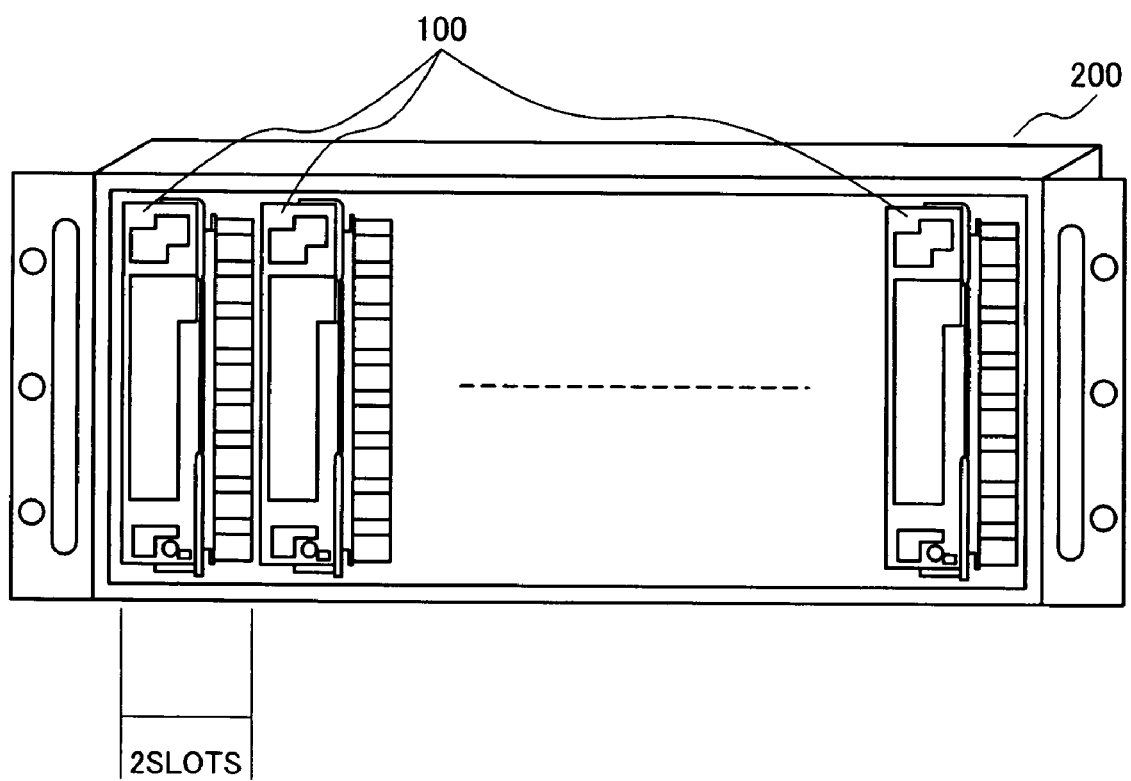
FIG. 11 is a front view showing a blade server including the plurality of server blades of dual CPU mounting.

Next, an example of a blade server which includes the plurality of server blades of dual CPU mounting is explained. FIG. 11 is a front view showing a blade server including the plurality of server blades of dual CPU mounting.

As shown in FIG. 11, the blade server 200 is equipped with a required number of server blades 100 at intervals of two slots in the server frame. On the other hand, in single CPU, the blade server 200 is equipped with a required number of server blades 100 at interval of one slot in the server frame.

Next, a description will be given about operation state of the server blade according to the present invention. As shown in FIGS. 10A and 10B, the CPU 5 mounted on the main surface side of the plate 1d (frame 1) is covered with the heat sink 3, and the extension CPU 8 is covered with the heat sink 4 mounted on the back face side of the frame 1. Although the CPU 5 and the extension CPU 8 generate heat during operations, the heat from two CPUs is diffused in the whole the heat sinks 3 and 4. And, although a surface temperature of the heat sinks 3 and 4 rises with the heat from each of CPUs, the heat sinks 3 and 4 are cooled by the air flow 19 which flows along the main surface side and rear face side of the frame 1.

As mentioned above, the exemplary heat sink mounting device and the server blade using the same according to the present invention is efficiently securable the mounting space of the heat sinks 5 and 8 required for cooling the dual CPU mounted in the server blade. Moreover, since the CPU 5 and the extension CPU 8 are mounted with dividing into front-back both sides of the frame 1, for example, the extension CPU 8 mounted in the rear face side of the frame 1 does not receive directly the wind warmed by the CPU 5 mounted in the main surface side of the frame 1. Therefore, each of the heat sinks 3 and 4 can take the large cross-section area which receives fresh air flow. Further, since the mounting position of each of CPUs and heat sinks for cooling the CPUs is near, the cooling efficiency of each of the heat sinks can be raised.

Also, according to the exemplary embodiment of the present invention, the main board can be used in common for the single CPU or the dual CPU.

Moreover, it is not necessary to remove the heat sink for cooling the single CPU in case of CPU extension. The effect is effective to the next subject. Once a power supply is supplied to the CPU, the thermal interface sticks to both the CPU and the heat sink for cooling the CPU by heat generation of the CPU. That is, it becomes difficult to remove the heat sink. If the heat sink has been removed, it will be necessary to remove the thermal interface stuck to both the CPU and the heat sink. Therefore, workability worsens. In the present invention, a CPU and a heat sink for cooling the CPU can be extended without removing the heat sink for cooling the single CPU.

Furthermore, although the above-mentioned embodiment relates to the heat sink mounting device and mounting method for cooling a CPU, the present invention is limited to cooling the CPU. The present invention can apply to other heating electronic device, for example, a high-speed or large-scale integrated circuit, a power amplifier and so on.

The previous description of embodiments is provided to enable a person skilled in the art to make and use the present invention.

Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

Further, it is noted that the inventor's intent is to retain all equivalents of the claimed invention even if the claims are amended during prosecution. This application is based on Japanese Patent Application No. JP 2006-070015 filed on Mar. 14, 2006, and including a specification, claims, drawings and summary. The disclosure of the above Japanese Patent Application is incorporated herein by reference in its entirety.

What is claimed is:

1. A heat sink mounting device comprising:
   a first board which includes an opening;
   a first electronic device which is mounted on a main surface of the first board;
   a second board which is attached on the main surface of the first board to permit the opening to be covered;

a second electronic device which is mounted on the second board through the opening from a rear face side of the first board;

a first heat sink which is mounted in the main surface side of the first board to permit the first electronic device and the opening to be covered; and a second heat sink which is mounted in the rear face side of the first board to permit the second electronic device and the opening to be covered.

2. The heat sink mounting device according to claim 1, wherein the first board and second board are electrically connected by using a connector attached at circumference of the opening.

3. The heat sink mounting device according to claim 1, wherein the second board and second electronic device are electrically connected by using a socket attached on the second board.

4. The heat sink mounting device according to claim 1, wherein the first heat sink and second heat sink have a size about equal to the size of the height direction of the first board mounted to an electronic apparatus.

5. A server blade comprising the heat sink mounting device according to claim 1, the server blade is included at a predetermined slot interval in a blade server.

6. A server blade comprising the heat sink mounting device according to claim 2, the server blade is included at a predetermined slot interval in a blade server.

7. A server blade comprising the heat sink mounting device according to claim 3, the server blade is included at a predetermined slot interval in a blade server.

8. A server blade comprising the heat sink mounting device according to claim 4, the server blade is included at a predetermined slot interval in a blade server.

9. A heat sink mounting method comprising:

forming an opening in a first board;

mounting a first electronic device on a main surface of the first board;

attaching a second board on the main surface of the first board to permit the opening to be covered;

mounting a first heat sink in the main surface side of the first board to permit the first electronic device and the opening to be covered;

mounting a second electronic device on the second board through the opening from a rear face side of the first board; and mounting a second heat sink in the rear face side of the first board to permit the second electronic device and the opening to be covered.

* * * * *

UNITED STATES PATENT AND TRADEMARK OFFICE
CERTIFICATE OF CORRECTION

PATENT NO. : 7,443,687 B2 Page 1 of 1
APPLICATION NO. : 11/715853
DATED : October 28, 2008
INVENTOR(S) : Koichi Fujioka It is certified that error appears in the above-identified patent and that said Letters Patent is hereby corrected as shown below:

On the Title Page Item (73) change Assignee: "NEC Corporation, Kawasaki, Kanagawa, Japan" to Assignee: "NEC Corporation, Tokyo, Japan".

Signed and Sealed this

Sixteenth Day of December, 2008

JON W. DUDAS
*Director of the United States Patent and Trademark Office*